United States Patent [19]

Yasuda et al.

[11] Patent Number: 4,589,004
[45] Date of Patent: May 13, 1986

[54] SEMICONDUCTOR DEVICE MONOLITHICALLY COMPRISING A V-MOSFET AND BIPOLAR TRANSISTOR ISOLATED FROM EACH OTHER

[75] Inventors: Seiji Yasuda; Toshio Yonezawa, both of Yokosuka; Shunichi Hiraki, Fujisawa; Masafumi Miyagawa, Kitakyushu, all of Japan

[73] Assignee: Tokyo Shibaura Denki Kabushiki Kaisha, Japan

[21] Appl. No.: 665,506

[22] Filed: Oct. 30, 1984

Related U.S. Application Data

[63] Continuation of Ser. No. 354,032, Mar. 2, 1982, abandoned.

[30] Foreign Application Priority Data

Mar. 30, 1981 [JP] Japan .................. 56-46906

[51] Int. Cl.[4] ............. H01L 29/78; H01L 27/02
[52] U.S. Cl. ................. 357/23.4; 357/23.8; 357/41; 357/43; 357/88
[58] Field of Search ............ 357/23.4, 23.8, 41, 357/43, 46, 89, 91, 92, 88

[56] References Cited

U.S. PATENT DOCUMENTS

| | | | |
|---|---|---|---|
| 4,007,478 | 2/1977 | Yagi | 357/23 VD |
| 4,202,006 | 5/1980 | Khajezadeh | 357/89 |
| 4,225,877 | 9/1980 | Miles et al. | 357/43 |
| 4,258,379 | 3/1981 | Watanabe et al. | 357/43 |
| 4,366,495 | 12/1982 | Goodman et al. | 357/23 VD |
| 4,376,286 | 3/1983 | Lidow et al. | 357/23 VD |
| 4,402,003 | 8/1983 | Blanchard | 357/23.4 |

FOREIGN PATENT DOCUMENTS

| | | | |
|---|---|---|---|
| 52-65689 | 5/1977 | Japan | 357/43 |
| 54-24583 | 2/1979 | Japan | 357/23 VD |

OTHER PUBLICATIONS

F. Barson, "Integrated Complementary Field-Effect and Bipolar Transistor Process", *IBM Technical Disclosure Bulletin*, vol. 17 (1974) pp. 86–87.

*Primary Examiner*—James J. Carroll
*Attorney, Agent, or Firm*—Finnegan, Henderson, Farabow, Garrett & Dunner

[57] ABSTRACT

A semiconductor device comprising a high voltage withstanding vertical MOSFET and a low voltage withstanding element both formed on a single chip. A buried layer of a high impurity concentration is formed in a region where the vertical MOSFET is formed, and another buried layer of a high impurity concentration is formed in a region where the low voltage withstanding element is formed. These buried layers have different thickness, whereby the series resistance of a circuit adjacent to the vertical MOSFET is reduced without lowering the withstand voltage of the vertical MOSFET.

3 Claims, 11 Drawing Figures

(A)

(B)

(A)

(B)

4,589,004

SEMICONDUCTOR DEVICE MONOLITHICALLY COMPRISING A V-MOSFET AND BIPOLAR TRANSISTOR ISOLATED FROM EACH OTHER

This application is a continuation of application Ser. No. 06/354,032, filed Mar. 2, 1982 now abandoned.

BACKGROUND OF THE INVENTION (1) Field of the Invention:

The present invention relates to a semiconductor device, and more particularly to a semiconductor device which comprises a high voltage withstanding vertical MOS transistor and a low voltage withstanding element, both formed on the same chip.

(2) Description of the Prior Art:

FIG. 1 is a sectional view of a known vertical MOS field effect transistor (hereinafter called "MOSFET"). The MOSFET comprises an n+-type silicon substrate 1. On the silicon substrate 1 an n-type epitaxial silicon layer 2 is formed. In the layer 2, p-type impurity regions 3, 3' are formed, both having a surface flush with the surface of the layer 2. Further, n+-type impurity regions 4, 4' are formed in the p-type impurity regions 3, 3', respectively. The n+-type impurity regions 4 and 4' have surfaces flush with those of the p-type impurity regions 3 and 3', respectively. These regions 3, 3', 4 and 4' are formed by double diffusion method.

On the entire upper surface of the n-type layer 2 there is formed an oxide film 6. The film 6 has thin portions 5 and 5'. The thin portion 5 lies partly on that portion of the region 3 which faces the region 3' and partly on that portion of the region 4 which is continuous to said portion of the region 3. Similarly, the thin portion 5' lies partly on that portion of the region 3' which faces the region 3 and partly on that portion of the region 4' which is continuous to said portion of the region 3'. The oxide film 6 has two contact holes at such positions that the p-type impurity region 3 and the n+-type impurity region 4 are partly exposed through one of the holes and the p-type impurity region 3' and the n+-type impurity region 4' are partly exposed through the other hole. A gate electrode 7 is formed on the thin portions 5 and 5' of the oxide film 6 and on that portion of the film 6 which lies between the thin portions 5, 5'. Further, a source electrode 8 is provided which is in ohmic contact with the p-type impurity region 3 and the n+-type impurity region 4 through one of said contact holes. Another source electrode 8' is provided which is also in ohmic contact with the p-type impurity region 3' and the n+-type impurity region 4' through the other contact hole. A drain electrode 9 is formed on the lower surface of the n+-type silicon substrate 1.

When the vertical MOSFET of FIG. 1 is operated, a channel inversion layer is formed in that portion of either p-type impurity region which lies below the gate electrode 7. Then, the n+-type impurity regions 4, 4' function as a source, whereas the n-type epitaxial silicon layer 2 functions as a drain. As a result, drain current flows in the direction of arrows as shown in FIG. 1. At the same time, the voltage applied between the source and the drain generates in the n-type epitaxial layer 2 such an electric field having such intensity distribution as shown by broken lines.

The vertical MOSFET has no minority carrier storage effect. It has therefore high-speed switching characteristic and good high-frequency characteristic. In addition, for its positive thermal coefficient of resistivity it scarcely undergoes secondary breakdown. Because of these desirable electrical properties the vertical MOSFET is used as a high voltage withstanding, large output element. In particular, it is useful as an element to deliver a large output from a circuit including bipolar transistors. (Hereinafter, a circuit including bipolar transistors and vertical MOSFETs will be called "BiMOS circuit".)

FIG. 2 is a circuit diagram of a BiMOS circuit. The BiMOS circuit is a converter circuit for a three-phase induction motor, which has a vertical MOSFET provided at the output stage. Semiconductor devices similar to such BiMOS circuit as shown in FIG. 2, i.e. integrated circuits including vertical MOSFETs and low voltage withstanding elements such as bipolar transistors—all formed on a single chip, are now increasingly demanded. If low voltage withstanding elements such as bipolar transistors are to be formed in the epitaxial layer 2 of such a vertical MOSFET as shown in FIG. 1, the following problems arise.

First, in the vertical MOSFET shown in FIG. 1 the n-type epitaxial layer 2 must be made so thick that a depletion layer may extend far enough to provide a sufficiently high withstand voltage between the source and drain. If a low voltage withstanding element is formed in the n-type epitaxial layer 2, it is necessary to make the layer 2 thinner in order to reduce the series resistance of the element. Hence, if a circuit such as BiMOS circuit which comprises a vertical MOSFET and a circuit including a low voltage withstanding element is to be formed on a single semiconductor substrate, either the withstand voltage of the vertical MOSFET or the series resistance of the adjacent circuit should inevitably be sacrificed. In other words, both the withstand voltage and the series resistance cannot be improved to a satisfactory degree. Further, if the epitaxial layer 2 is made thick, thus ensuring the high voltage withstand characteristic of the vertical MOSFET, another problem will arise in addition to the rising of the series resistance of the adjacent circuit. That is, as evident from the drain current flow shown in FIG. 1, on-resistance of the vertical MOSFET will unavoidably increase.

SUMMARY OF THE INVENTION

It is a primary object of the present invention to provide a semiconductor device which comprises a vertical MOSFET and a low voltage withstanding element such as a bipolar transistor, both integrally formed on a single chip and in which the series resistance of an adjacent circuit including said element can be reduced while the high voltage withstand characteristic of the vertical MOSFET is maintained.

Another object of the invention is to provide a semiconductor device which comprises a vertical MOSFET and a low voltage withstanding element such as a bipolar transistor, both integrally formed on a single chip and in which the series resistance of an adjacent circuit including said element and the on-resistance of said vertical MOSFET are reduced while the high voltage withstand characteristic of the vertical MOSFET is maintained.

The above-mentioned primary object of the invention is achieved by forming a semiconductor layer of a first conductivity type on a semiconductor substrate of a second conductivity type, forming a vertical MOSFET and a low voltage withstanding element such as a bipolar transistor in the semiconductor layer, forming a thin buried layer of a high impurity concentration in the region where the vertical MOSFET is formed, and forming a thick buried layer in the region where said element is formed.

The above-mentioned other object of the invention is attained by forming a semiconductor layer, a vertical MOSFET, a low voltage withstanding element, a thin buried layer of a high impurity concentration and a thick buried layer in the same manner as described in the preceding paragraph and by forming another thick buried layer of a high impurity concentration below the gate electrode of said vertical MOSFET.

The present invention can be effectively applied to an integrated circuit which comprises a vertical MOSFET having a withstand voltage of 100 V to 200 V and a low voltage withstanding element having a withstand voltage of 50 V or less, both formed on a single chip. In particular, the invention is effective when applied to such a BiMOS circuit formed on a single chip as illustrated in FIG. 2.

DETAILED DESCRIPTION OF THE PREFERRED EMBODIMENTS

Figure 3:
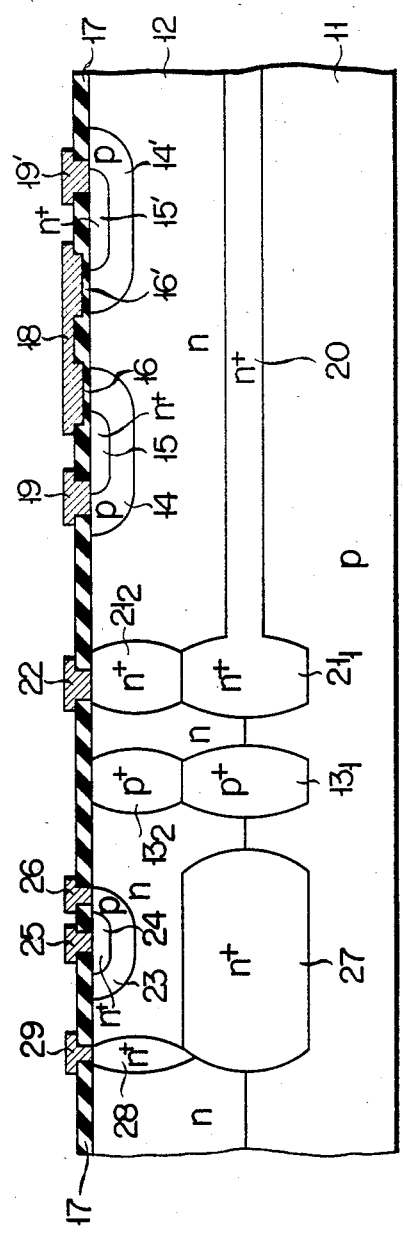
FIG. 3 is a sectional view of a semiconductor device, a first embodiment of the present invention.

FIG. 3 shows a semiconductor device, a first embodiment of the present invention. As shown in FIG. 3, the semiconductor device comprises a p-type silicon substrate 11 and an n-type epitaxial silicon layer 12 formed on the p-type silicon substrate 11. The layer 12 is 30 $\mu$m thick and has an impurity concentration of $2\times10^{14}/cm^3$. Partly in the substrate 11 and partly in the layer 12 there is formed a p+-type isolation region $13_1$. Further in the layer 12 another p+-type isolation region $13_2$ is formed with its top surface flush with the upper surface of the layer 12. Both isolation regions $13_1$ and $13_2$ have an impurity concentration of $1\times10^{20}/cm^3$. These isolation regions $13_1$, $13_2$ are mutually contacting and aligned vertically. They partition the n-type epitaxial layer 12 into two parts. In a first part of the layer 12 a vertical MOSFET is formed, and in the second part of the layer 12 a bipolar transistor is formed.

In the first part of the layer 12 two p-type regions 14, 14' of an impurity concentration of $5\times10^{18}/cm^3$ are formed. Both regions 14, 14' have a depth of 5 $\mu$m, and their surfaces are flush with that of the first part of the layer 12. Further, two n+-type regions 15, 15' of an impurity concentration of $1\times10^{20}/cm^3$ are formed in the p-type regions 14 and 14', respectively. The regions 15 and 15' have a depth of 3 $\mu$m, and their surfaces are flush with those of the p-type regions 14 and 14'. On the entire surface of the n-type layer 12 a field oxide film 17, 1 $\mu$m thick, is formed. The film 17 has thin portions 16 and 16'. The thin portion 16 lies partly on that portion of the region 14 which faces the region 14' and partly on that portion of the region 15 which is continuous to said portion of the region 14. Similarly, the thin portion 16' lies partly on that portion of the region 14' which faces the region 14 and partly on that portion of the region 15' which is continuous to said portion of the region 14'. These portions of the regions 14, 14' constitute a channel region of the vertical MOSFET. A gate electrode 18 is formed on the thin portions 16, 16' of the film 17 and that portion of the film 17 which lies between the thin portions 16 and 16'. The oxide film 17 has one contact hole through which the p-type region 14 and the n+-type region 15 are partly exposed. It has another contact hole through which the p-type region 14' and the n+-type region 15' are partly exposed. A source electrode 19 is provided in ohmic contact with the p-type region 14 and the n+-type region 15 through said one contact hole. Another source electrode 19' is provided in ohmic contact with the n-type region 14' and the n+-type region 15' through said another contact hole. Further, an n+-type buried layer 20 of an impurity concentration of $5\times10^{19}/cm^3$ is formed between the p-type silicon substrate 11 and the first part of the n-type epitaxial layer 12. The buried layer 20 is 10 $\mu$m thick and extends 5 $\mu$m into the p-type silicon substrate 11 and 5 $\mu$m into the n-type epitaxial layer 12. The layer 20 is connected to an n+-type diffusion layer $21_1$ formed partly in the substrate 11 and partly in the first part of the layer 12. The diffusion layer $21_1$ is connected to another n+-type diffusion layer $21_2$ formed in the first part of the layer 12 with its upper surface located flush with that of the layer 12. These n+-type diffusion layers $21_1$ and $21_2$ are mutually aligned vertically. The layer $21_2$ is in ohmic contact with a drain electrode 22 which is formed partly in a contact hole made in the oxide film 17.

In the second part of the n-type epitaxial layer 12 there is formed a p-type base region 23 with its upper surface positioned flush with that of the layer 12. The region 23 is 5 $\mu$m deep and has an impurity concentration of $5\times10^{18}/cm^3$. In the base region 23 an n+-type emitter region 24 is formed, which is 3 $\mu$m deep and which has an impurity concentration of $1\times10^{20}/cm^3$, with its upper surface flush with that of the base region 23. The emitter region 24 is in ohmic contact with an emitter electrode 25 formed partly in a contact hole made in the oxide film 17. The base region 23 is also in ohmic contact with a base electrode 26 formed partly in a contact hole made in the oxide film 17. Between the second part of the layer 12 and the p-type substrate 11 an n+-type buried layer 27 is formed, and which has an impurity concentration of $5\times10^{19}/cm^3$. The n+-type buried layer 27 is 25 $\mu$m thick, extending 12.5 $\mu$m into the p-type substrate 11 and extending 12.5 $\mu$m into the n-type epitaxial layer 12. The buried layer 27 is connected to an n+-type diffusion layer 28 formed in the second part of the layer 12. The layer 28 is in ohmic contact with a collector electrode 29 which is formed partly in a contact hole made in the oxide film 17.

Hence, the semiconductor device shown in FIG. 3 includes a vertical MOSFET having an intended withstand voltage of 150 V and a low voltage withstanding bipolar transistor having an intended withstand voltage of 50 V. The n+-type buried layer 20 is thin, extending 5 μm into the first part of the layer 12, whereas the n+-type buried layer 27 is thick, extending 12.5 μm into the second part of the layer 12. The epitaxial layer 12 therefore has an effective thickness of 20 μm, which determines the withstand voltage of the vertical MOSFET and which is equal to the distance between the bottom of the p-type region 14 and the upper surface of the n+-type buried layer 20 (=30 μm−5 μm−5 μm). Its effective thickness being sufficient, the layer 12 impart a sufficiently high withstand voltage to the vertical MOSFET. By contrast, the second part of the n-type epitaxial layer 12 has a smaller effective thickness of 12.5 μm (=30 μm−12.5 μm−5 μm). The effective thickness of the second part of the layer 12 is small enough to impart a low series resistance to the bipolar transistor.

Therefore, the semiconductor device of FIG. 3 meets the demand that in an IC device having a vertical MOSFET and a bipolar transistor both formed on a single chip the series resistance of the bipolar transistor should be low while the high voltage withstand characteristic of the vertical MOSFET is maintained.

Figure 4:
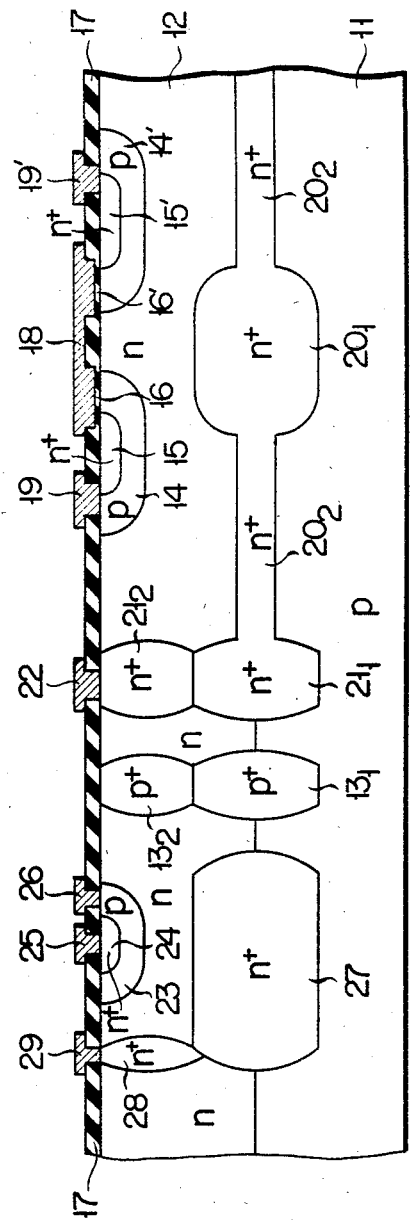
FIG. 4 is a sectional view of another semiconductor device, a second embodiment of the invention.

FIG. 4 shows another semiconductor device, a second embodiment of the present invention. This device is identical with the device shown in FIG. 3, except that that portion of an n+-type buried layer which is located below a gate electrode 18 is thicker than the other portions of the buried layer. More precisely, the n+-type buried layer consists of an intermediate portion $20_1$ and end portions $20_2$. The intermediate portion $20_1$, which lies right below the gate electrode 18, is 25 μm thick, extending 12.5 μm into a p-type silicon substrate 11 and extending also 12.5 μm into an n-type epitaxial layer 12. The end portions $20_2$ are 10 μm thick, each extending 5 μm into the substrate 11 and 5 μm into the layer 12. Hence, that portion of the epitaxial layer 12 which is located below the gate electrode 18 has a smaller effective thickness than the other portions. This hardly affects the high voltage withstand characteristic of a vertical MOSFET, for the following reason.

Figure 1:
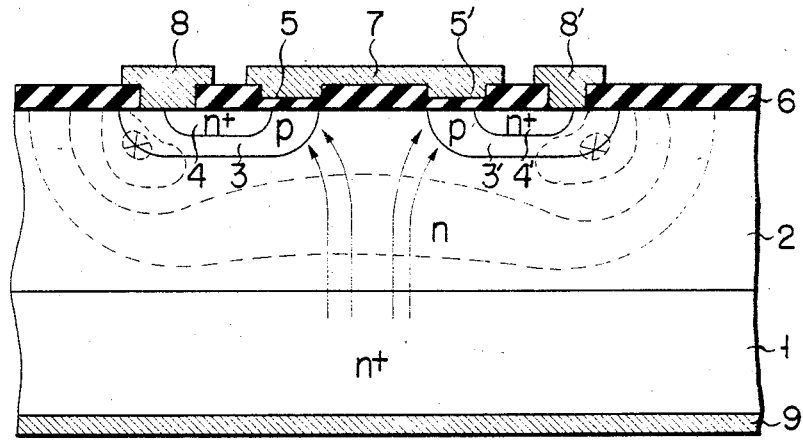
FIG. 1 is a sectional view of a known vertical MOSFET.
Figure 2:
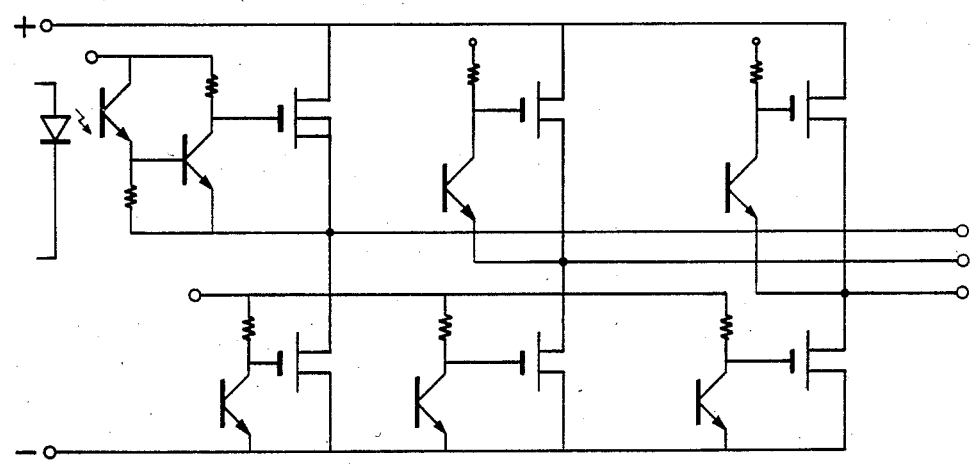
FIG. 2 shows a circuit including a vertical MOSFET and bipolar transistors of a low withstand voltage.

As FIG. 1 clearly shows, the electric field is less intense in that portion of the n-type layer 2 which lies beneath the gate electrode 7. This is because the depletion layers developing from the p-type regions 3, 3' owing to so-called field plate effect will mutually contact, thus forming a single depletion layer, and that portion of the single depletion layer extend almost straight in horizontal direction. As a result, the electric field is concentratedly intense in those portions of the layer 2 which are identified by mark X, in the vicinity of the rounded portions of the regions 3, 3' which are close to the source electrodes 8 and 8', respectively.

Similarly, in the semiconductor device of FIG. 4 an electric field is less intense in that portion of the n-type epitaxial layer 12 which lies beneath the gate electrode 18 of the vertical MOSFET. Accordingly the high voltage withstand characteristic of the vertical MOSFET can be maintained even if said portion of the layer 12 has a smaller effective thickness so far as the other portions of the layer 12 where the electric field is concentratedly intense are made fully thick. The semiconductor device of FIG. 4 can therefore achieve the same effect as the device shown in FIG. 3.

Further, the semiconductor device of FIG. 4 is advantageous in that the on-resistance of the vertical MOSFET is reduced since that portion of the n-type epitaxial layer 12 in which drain current flows is made thinner than the other portions. This will be theoretically proved, with reference to FIGS. 5(A) and 5(B) which are schematical sectional views of the devices of FIGS. 3 and 4, respectively.

Figure 5:
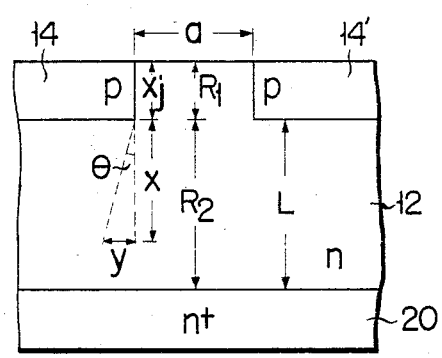
FIG. 5(A) is a schematical sectional view of a vertical MOSFET included in the first embodiment of the invention, illustrating how to calculate the on-resistance of the vertical MOSFET.
FIG. 5(B) is a schematical sectional view of a vertical MOSFET included in the second embodiment of the invention, illustrating how to calculate the on-resistance of the vertical MOSFET.
Figure 5:
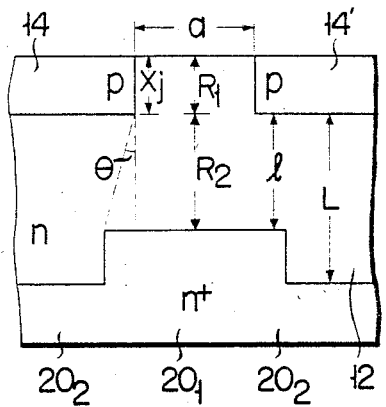

In FIG. 5(A), a is the gap between the p-type regions 14 and 14', $X_j$ is the depth of the p-type regions 14, 14', L is the effective thickness of those portions of the layer 12 which lie below the p-type regions 14 and 14', and θ is the angle at which a drain current path diverges. The resistance of the n+-type buried layer 20 is negligibly low. The on-resistance of the drain region of the vertical MOSFET is thus virtually equal to the sum of the resistance $R_1$ of that portion of the drain region which is $X_j$ thick and the resistance $R_2$ of that portion of the drain region which is L thick. That is:

$$R = R_1 + R_2 \tag{1}$$

$R_1$ and $R_2$ are given as follows:

$$R_1 = \rho X_j/a^2, \tag{2}$$

$$R_2 = \rho \int_0^L \frac{dx}{(a + 2y)^2} \tag{3}$$

$$= \rho \int_0^L \frac{dx}{(a + 2\tan\theta \cdot x)^2}$$

$$= \frac{\rho}{4\tan^2\theta} \int_0^L \frac{dx}{\left(x + \frac{a}{2}\cot\theta\right)}$$

$$= \frac{\rho L}{a(a + 2L \cdot \tan\theta)}.$$

In equations (2) and (3), ρ is the specific resistance of the n-type epitaxial layer 12 (or drain region). ρ=25 Ωcm. And θ=30°. Further, a=20 μm, $X_j$=5 μm and L=20 μm. Hence, as evident from equations (1), (2) and (3), R is given:

$$R = 9.52 \times 10^3 \, \Omega.$$

In FIG. 5(B) which is a schematical sectional view of the device of FIG. 4, a is the gap between the p-type regions 14, 14', $X_j$ is the depth of the p-type regions 14, 14', l is the effective thickness of those portions of the layer 12 which lie below the facing end portions of the p-type regions 14, 14', and θ is the angle at which a drain current path diverges. The resistances of the all portions $20_1$ and $20_2$ of the buried layer is negligibly low. The on-resistance of the drain region of the vertical MOSFET is thus virtually equal to the sum of the resistance $R_1$ of the that portion of the drain region which is $X_j$ thick and the resistance of $R_2$ of that portion of the drain region which is l thick. Thus, equation (1) holds true of this case, too. And $R_1$ is given by equation (2), too. $R_2$ is given as follows:

$$R_2 = \rho \int_0^l \frac{dx}{(a + 2y)^2} \tag{3'}$$

$$= \rho \int_0^l \frac{dx}{(a + 2\tan\theta \cdot x)^2}$$

-continued $$= \frac{\rho}{4\tan^2\theta} \int_0^l \frac{dx}{\left(x + \frac{a}{2}\cot\theta\right)}$$

$$= \frac{\rho l}{a(a + 2l \cdot \tan\theta)}.$$

In equations (2) and (3'), $\rho$ is the specific resistance of the n-type epitaxial layer 12 (or drain region) $\rho = 25$ $\Omega$cm. As in the case of the device of FIG. 3, $\theta = 30°$, $a = 20$ $\mu$m and $X_j = 5$ $\mu$m. But $l = 7.5$ $\mu$m. Hence, as evident from equations (1), (2) and (3'), R is given:

$$R = 8.57 \times 10^3 \, \Omega.$$

Obviously, the on-resistance of the vertical MOSFET of the device shown in FIG. 4 is lower than that of the vertical MOSFET formed in the device of FIG. 3.

Both semiconductor devices of FIGS. 3 and 4 have n+-type buried layers which have different thicknesses. Now it will be described how to manufacture such a semiconductor device. More precisely, it will be described how to manufacture the device of FIG. 4 with reference to FIGS. 6(A) to 6(E).

Figure 6:
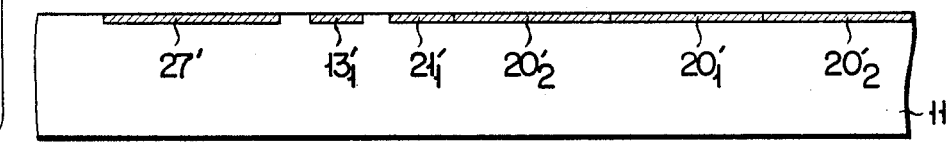
FIGS. 6(A) to 6(E) illustrate how to manufacture the semiconductor device of FIG. 4, the second embodiment of the present invention.
Figure 6:
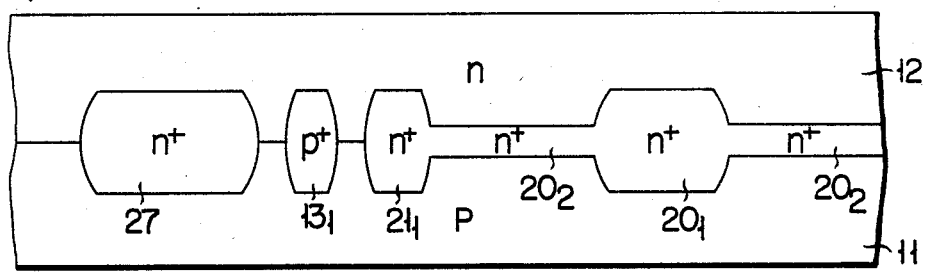
Figure 6:
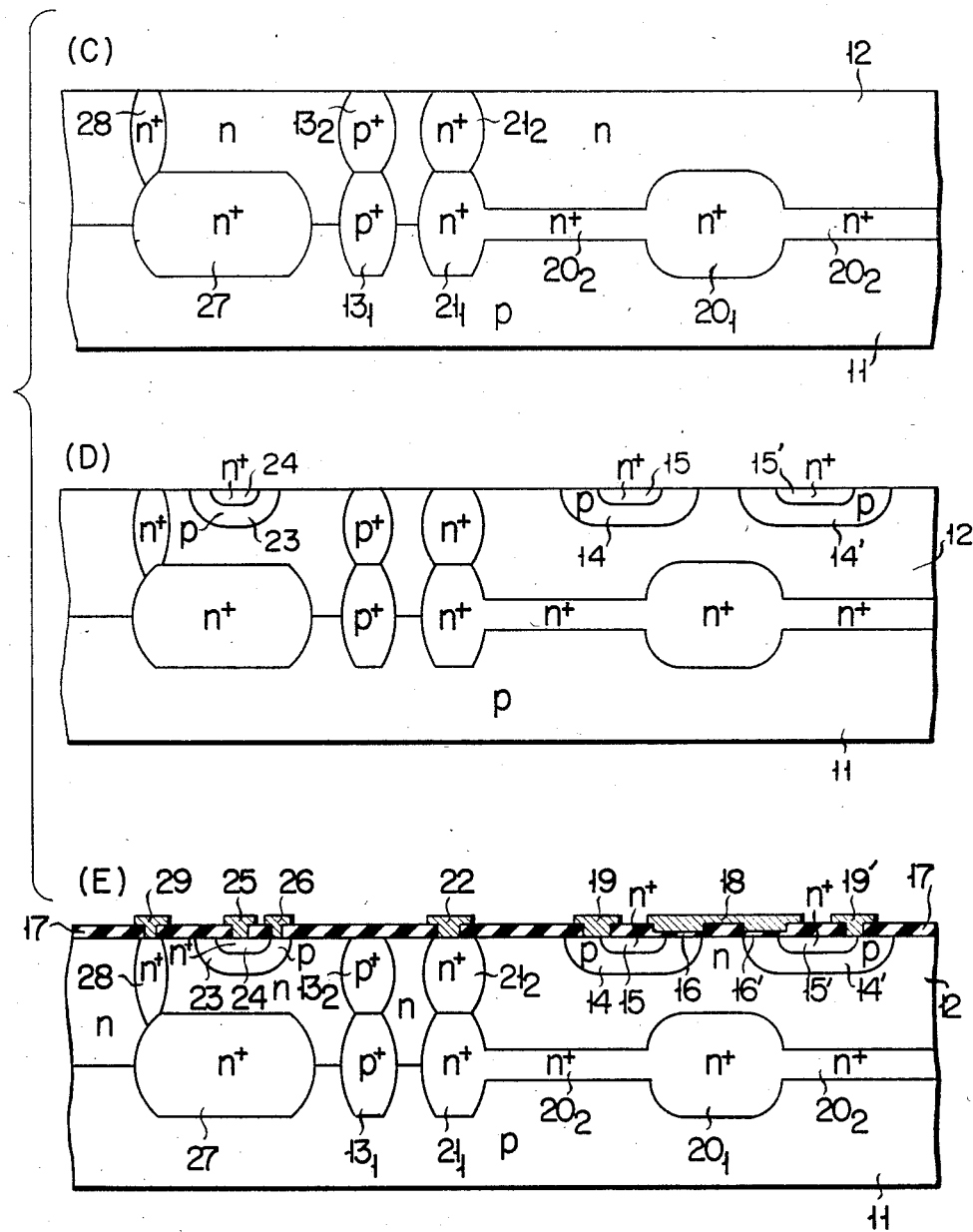

First, as shown in FIG. 6(A), impurities such as phosphorus, arsenic and boron are diffused selectively into respective portions of the p-type silicon substrate 11, thus forming diffusion layers 27', 13$_1$', 21', 20$_1$' and 20$_2$', each having a high impurity concentration. The layer 27' is a phosphorus-doped layer lying on that portion of the substrate 11 where the n+-type buried layer 27 will be formed. The layer 13$_1$' is a boron-doped layer lying on that portion of the substrate 11 where the p+-type isolation region 13$_1$ will be formed. The layer 21$_1$' is a phosphorus-doped layer lying on that portion of the substrate 11 where the n+-type diffusion layer 21$_1$ will be formed. The layer 20$_1$' is a phosphorus-doped layer lying on that portion of the substrate 11 where the intermediate portion 20$_1$ of the n+-type buried layer will be formed. And the layers 20$_2$' are arsenic-doped layers lying on those portions of the substrate 11 where the end portions 20$_2$ of the n+-type buried layer will be formed.

Then, the n-type epitaxial layer 12 is deposited on the entire upper surface of the substrate 11. As the layer 12 is being formed at a high temperature, the impurities in the layers 27', 13', 31$_1$', 20$_1$' and 20$_2$' diffuse, thus forming the n+-type buried layer 27, the p+-type isolation region 13$_1$, the n+-type diffusion layer 21$_1$ and the n+-type buried layer consisting of portions 20$_1$ and 20$_2$. Since phosphorus has a greater diffusion coefficient than arsenic, the phosphorus-doped buried layer 27 and the intermediate portion 20$_1$ of the other buried layer are made thicker than the end portions 20$_2$ of the other buried layer. As a result, such a structure as shown in FIG. 6(B) is obtained.

Boron is diffused from the upper surface of the epitaxial layer 12, thus forming the p+-type isolation region 13$_2$, whose upper surface is flush with that of the layer 12 and which is in contact with the p+-type isolation layer 13$_1$. Hence, the regions 13$_1$ and 13$_2$ electrically isolate the first part of the layer 12 where the vertical MOSFET will be formed from the second part of the layer 12 where the bipolar transistor will be formed. Thereafter, phosphorus is selectively diffused into the layer 12, thereby forming the n+-type difusion layer 21$_2$ and the n+-type diffusion layer 28. Thus obtained is such a structure as illustrated in FIG. 6(C).

Boron is then selectively diffused into the layer 12, thus forming the p-type regions 14, 14' of the vertical MOSFET and the p-type base region 23 of the bipolar transistor. This done, phosphorus is selectively diffused into the regions 14 and 14', thereby forming therein the n+-type source regions 15 and 15'. Further, phosphorus is selectively diffused into the p-type base region 23, thus forming the n+-type emitter region 24. Thus obtained is such a structure as illustrated in FIG. 6(D).

Thereafter, the oxide film 17 having with the aforementioned thin portions 16 and 16' is formed on the entire upper surface of the structure shown in FIG. 6(D) by the known method. Contact holes are then made in the oxide film 17 also by the known method. This done, the electrodes 18, 19, 19', 25, 26 and 29 are formed. Thus ends the manufacture of the semiconductor device shown in FIG. 4. (See FIG. 6(E).)

The embodiments described above are semiconductor device with an n-channel vertical MOSFET and an npn-type bipolar transistor both formed on a single chip. The invention, however, is not limited to these embodiments. It may be applied to a semiconductor device with a p-channel type vertical MOSFET and a pnp-type bipolar transistor both formed on the same chip. Further it may be applied to an integrated circuit having a vertical MOSFET and a low voltage withstanding element other than a bipolar transistor, such as a diode.

What we claim is:

1. A semiconductor device, comprising:
   a semiconductor substrate of a first conductivity type;
   a semiconductor layer of a second conductivity type opposite to said first conductivity type, said semiconductor layer being formed on said substrate;
   an isolation diffusion layer of the first conductivity type selectively formed in said semiconductor layer across said semiconductor layer in its thickness direction so as to divide said semiconductor layer into first and second element regions;
   a first inpurity region of the first conductivity type formed in said first element region;
   a first electrode formed in ohmic contact with said first impurity region;
   a first buried region containing a high concentration of an impurity of the second conductivity type located between the first element region and the substrate, and being of a predetermined thickness with a surface sufficiently close to said first impurity region for providing low series resistance in said first element region;
   a second impurity region of the first conductivity type formed in the second element region and having a predetermined depth measured from the surface of the semiconductor layer, said second impurity region being divided into two parts with a portion of said semiconductor layer extending intermediate said two parts of the second impurity region, the surface of said intermediate portion of said semiconductor layer being generally flush with the surface of said two parts of said second impurity region;
   a third impurity region of the second conductivity type formed within and extending downward from the surface of each divided part of the second impurity region;

a gate electrode formed over that portion of the semiconductor layer positioned intermediate the divided two parts of the second impurity region and over an inside portion of each of the divided two parts of the second impurity region;

a gate insulation film interposed between said gate electrode and said second impurity region and said intermediate portion of said semiconductor layer, the portion of said gate insulation film directly over said intermediate semiconductor layer portion being thicker than the portions of said gate insulation film directly over said inside portions of the divided two parts of said second impurity region;

a source electrode formed in ohmic contact with said third impurity region;

a second buried region containing a high concentration of an impurity of the second conductivity type located between the second element region and the substrate, said second buried region having a thickened portion below the gate electrode such that the distance between the second buried region and the semiconductor layer surface is sufficiently small for providing low turn-on resistance in said second element region, and further having a thinned portion such that the surface of said thinned portion of said second buried region is sufficiently apart from the second impurity region for providing high voltage withstand characteristics insaid second element region, the thickened portion of the second buried region being positioned right under and being wider than the intermediate part of the semiconductor layer so as to extend under said two parts of said second impurity region;

an electrode take-out region containing a high concentration of an impurity of the second conductivity type impurity and extending from said thinned portion of the second buried region to reach the surface of the semiconductor layer; and a drain electrode formed in ohmic contact with said electrode take-out region.

2. A semiconductor device according to claim 1, wherein a vertical MOSFET formed in the second element region and comprising at least said second and third impurity regions and said electrode take-out region, has a withstanding voltage of 100–200 V, and a bipolar transistor formed in the first element region and comprising at least said first impurity region, has a withstanding voltage of 50 V or less.

3. A semiconductor device according to claim 1, wherein a bipolar transistor formed in the first element region includes the semiconductor layer of the second conductivity type as a collector region.

* * * * *